United States Patent
Fukuda

(10) Patent No.: US 6,919,870 B2
(45) Date of Patent: Jul. 19, 2005

(54) DRIVING CIRCUIT

(75) Inventor: Yasuhiro Fukuda, Saitama (JP)

(73) Assignee: Texas Instruments Incorporated, Dallas, TX (US)

( * ) Notice: Subject to any disclaimer, the term of this patent is extended or adjusted under 35 U.S.C. 154(b) by 630 days.

(21) Appl. No.: 09/887,594

(22) Filed: Jun. 22, 2001

(65) Prior Publication Data

US 2002/0047840 A1 Apr. 25, 2002

(30) Foreign Application Priority Data

Jun. 22, 2000 (JP) ........................................ 2000-187771

(51) Int. Cl.⁷ ................................................ G09G 3/36
(52) U.S. Cl. ........................... 345/90; 345/100; 326/26
(58) Field of Search ............................ 345/90, 92, 212, 345/100; 323/303; 326/26, 27; 349/42

(56) References Cited

U.S. PATENT DOCUMENTS

| | | | | |
|---|---|---|---|---|
| 5,343,089 A | * | 8/1994 | Itakura et al. ................. | 327/94 |
| 5,459,483 A | * | 10/1995 | Edwards ....................... | 345/98 |
| 5,798,747 A | * | 8/1998 | Moraveji ....................... | 345/98 |
| 6,130,549 A | * | 10/2000 | Buck ............................. | 326/26 |
| 6,232,946 B1 | * | 5/2001 | Brownlow et al. ............ | 345/98 |
| 6,236,195 B1 | * | 5/2001 | Nagatomo .................... | 323/303 |
| 6,456,270 B1 | * | 9/2002 | Itakura ......................... | 345/98 |

* cited by examiner

*Primary Examiner*—Xiao Wu
*Assistant Examiner*—M. Fatahiyar
(74) *Attorney, Agent, or Firm*—William B. Kempler; W. James Brady, III; Frederick J. Telecky, Jr.

(57) ABSTRACT

The objective of this invention is to compensate or avoid the influence of offset in an easy and efficient manner, to correctly match the voltage of the output signal with the voltage of the input signal, that is, the target value, and to significantly reduce the current consumption. When voltage follower 32L supplies bias voltage VBn to each of constant current source circuits 58L, 60L, it acts as a source-type voltage follower. However, when the bias voltage applied to each of constant current source circuits 58L, 60L is changed from VBn to Vss of the power supply voltage level, each of constant current source circuits 58L, 60L is turned off, and no current flows through them. When the constant current source circuit 58 is turned off in differential input part 44L, the potential at the output terminal (node) NL rises almost to the level of the power supply voltage Vdd. In this way, the driving transistor 62L is also turned off in output part 46L.

18 Claims, 6 Drawing Sheets

DRIVING CIRCUIT

FIELD OF THE INVENTION

The present invention pertains to a driving circuit that drives the voltage of an electric load. In particular, the present invention pertains to a voltage follower type driving circuit.

BACKGROUND OF THE INVENTION

The signal line driving circuit of a thin film transistor type liquid crystal display (TFT-LCD) that performs multi-gradation display is an application example of this type of driving circuit.

FIG. 5 shows the basic circuit configuration (in part) of a TFT liquid crystal panel. In this type of liquid crystal panel, multiple gate lines Yi−1, Yi, Yi+1 . . . and multiple signal lines Xj−1, Xj, and Xj+1 . . . are arranged in a matrix pattern. A pixel electrode P made of a transparent electroconductive film and a thin film transistor TFT is arranged for the pixel at each cross point. A signal storage capacitance CL for one pixel is formed by the liquid crystal Q sandwiched between each pixel electrode P and counter electrode COM.

All of the pixel electrodes Pi−1, j, Pi, j . . . in one column (for example, column j) are electrically connected to the common signal line Xj of each column via the respective thin film transistors TFTi−1, j, TFTi, j . . . . The control terminals of all of the thin film transistors TFTi, j−1, TFTi, j, TFTi, j+1 . . . in each row (for example, row i) are electrically connected to a common gate line Yi.

Gate lines Yi−1, Yi, Yi+1 . . . are usually sequentially selected one row (one line) at a time during one frame period (1 V) and are driven to an active state by a gate line driver (not shown in the figure). When a gate line, say, Yi is driven to the active state, that is, H level, all of the thin film transistors TFTi, j−1, TFTi, j . . . on that line (row i) are turned on. At the same time, the analog with respect to all of the pixels on row i are respectively output from the signal line driving parts (not shown in the figure) of the various rows. These are applied (written) to the signal lines Xj−1, Xj . . . of various rows and to the corresponding pixel electrodes Pi, j−1, Pi, j . . . through the respective thin film transistors TFTi, j−1, TFTi, j . . . in the on state. After that, gate line Yi+1 is selected for row (i+1), and the same operation is repeated as described above. By turning off the thin film transistors TFTi, j−1, TFTi, j . . . in row i, the electric charges written to each pixel lose their escape path, and the gradation voltage of each electrode Pi, j−1, Pi, j . . . can be retained until the next selection time.

FIG. 6 shows the configuration of the main parts of the signal line driving part used for driving one signal line Xj of the TFT liquid crystal panel.

In signal line driving part 100 for one channel, the input image data DX for one pixel is input to data latch circuit 102 corresponding to timing pulse TP supplied during one line period. The image data DX is gradation data that designates one of the $2^n$ display gradations that can be displayed by the number of bits n using the data values (d0, d1, . . . dn−1).

The image data DX input to latch circuit 102 are input to DA converter 106 after they are subjected to a voltage conversion from 3 V to 10 V performed in level converting circuit 104.

Multiple V0 to Vk−1 with positive polarity and V'k−1 to V'0 ($k=2^n$) with negative polarity, having voltage levels corresponding to all ($2^n$) of the set display gradations, are supplied from gradation voltage generating circuit 108, which is a voltage dividing resistance circuit for the entire channel, to DA converter 106.

An AC signal or inversion control signal RV used for inverting the gradation voltage for each line (horizontal scanning period H) is supplied from a controller (not shown in the figure) to DA converter 106. DA converter 106 decodes the image data DX for one pixel input from level converting circuit 104 and outputs the gradation voltage corresponding to the logic value of the inversion control signal RV from among the Vj and V'j by using the voltage level corresponding to the display gradation of the image data DX. For example, if RV has H level, the positive gradation voltage Vj is output. If RV has L level, the gradation voltage V'j with negative polarity is output. Although DA converter 106 is virtually a decoder circuit, it actually acts as a DA converter that converts digital data to analog voltages.

Voltage follower (driving circuit) 110 comprises an operational amplifier. It operates in a source mode when a gradation voltage with positive polarity is input. When a gradation voltage with negative polarity is input, it operates in a sink mode. It outputs an output voltage that is equal to the input voltage. The gradation voltage Vj output from voltage follower 110 is supplied to the signal line of the corresponding signal line Xj via output pad 112.

FIG. 7 shows the operation of the signal line driving part 100 for one channel which has the aforementioned configuration. As shown in the figure, when gate line Yi of row i in TFT liquid crystal panel is selected (FIG. 5), gradation voltage Vi, j with positive polarity is output onto signal line Xj from signal line driving part 100. The gradation voltage Vi, j with positive polarity is applied (written) to pixel electrode Pi, j via thin film transistor TFTi, j that is in the on state. Then, when the gate line Yi+1 of row (i+1) is selected, a gradation voltage Vi+i, j with negative polarity is output onto signal line Xj from signal line driving part 100. As a result, the gradation voltage Vi+1, j with negative polarity is applied (written) to pixel electrode Pi+1 via thin film transistor TFTi+1, j that is in the on state.

When the input image data DX is input to latch circuit 102 at the beginning of timing pulse TP during the operation of each line, the gradation voltage Vj corresponding to the value of the input image data DX is input to voltage follower 110 from DA converter 106 immediately after that. Until that time, the voltage of signal line Xj is maintained near the gradation voltage with an opposite polarity supplied to the pixel of the previous line.

When a new gradation voltage Vj is input from DA converter 106 to the non-inverting input terminal (+), voltage follower 110 performs negative feedback for the output voltage, that is, the signal line voltage with respect to the inverting input terminal (−), while raising or lowering the level (that is, driving the voltage of signal line Xj with a load) until it is almost consistent with the input gradation voltage Vj. During rise/drop of the output voltage or the signal line voltage, an operation current Id flows in each part of voltage follower 110. In particular, a charging current for the rise or a discharging current for the drop flows in the output part. After the output voltage (signal line voltage) almost reaches the level (target value) of the input gradation voltage Vj, a constant current Io generated by a constant current source circuit flows in voltage follower 110.

In said TFT-LCD, in order to perform gradation display with high accuracy, the signal line driving part of each channel must write the gradation voltage as indicated by the image data DX to each corresponding pixel electrode P. Therefore, voltage follower 110 must send the exact gradation voltage output from DA converter 106 to the signal line X on the output side.

In the operational amplifier that forms voltage follower 110, however, there are various offsets on the input side or in the amplifier (especially in the differential input part). Because of these offsets, the real value of the output voltage is usually different from the target value, that is, the voltage of the input signal. Although an adjustment circuit can be used to compensate or reduce the offsets, such adjustment is limited. In particular, because the signal line driver of a TFT-LCD has hundreds of voltage followers or driving circuits incorporated in one chip, it is difficult to eliminate the variation among so many driving circuits. Another method for solving the problem of the offsets is to improve the characteristics of the transistors that constitute the operational amplifier. This method, however, requires a very difficult process and a high cost. Also, the size of the transistors will be increased (that is, the area of the chip becomes larger).

Also, in the conventional voltage follower 110, because a constant current generated by an internal constant current source circuit flows in each part after the output voltage or signal line voltage almost reaches the target value, a constant current (idling-standby current) Io is consumed by the entire voltage follower. The current consumed by the entire driver is large.

A purpose of this invention is to solve said problems by providing a driving circuit that can easily and efficiently compensate or avoid the influence of the offsets and can correctly match the voltage of the output signal with the target value, that is, the voltage of the input signal.

Another purpose of the present invention is to provide a driving circuit that can significantly reduce the current consumed.

SUMMARY OF THE INVENTION

In order to realize the aforementioned purposes, the first driving circuit of the present invention is characterized by the following facts: the driving circuit has a high input impedance and a low output impedance; the driving circuit is equipped with an amplification part between the input terminal and output terminal; the driving circuit can output an output signal with a voltage that is almost equal to the input signal input to said input terminal; from the point in time when an input signal with a prescribed voltage is input to said input terminal to the point in time when the voltage of the output signal obtained at said output terminal reaches a level close to said prescribed voltage, said input and output terminals are electrically shorted, and said amplification part is turned off.

The second driving circuit of the present invention has the following parts: a differential input part which can differentially input a first and a second signal; an output part which is connected to an electric load, amplifies the output signal of said differential input part, and supplies the amplified signal to said load; a feedback circuit which feeds back the output signal obtained from said output part as the second signal to said differential input part; a bypass control means which can send an input signal with a prescribed voltage to said load through a circuit bypassed with respect to said differential input part and output part from the point in time when said input signal is input as the first signal to said differential input part to the point in time when the voltage of said output part reaches a level close to said prescribed voltage; and an operation control means which turns off said differential input part and/or output part when the voltage of the output signal of said output part reaches a level close to said prescribed voltage.

In the second driving circuit of the present invention, as a preferable embodiment, said bypass circuit is comprised of the aforementioned feedback circuit. The aforementioned bypass control means has a switch which is connected between the first and second input terminals used for inputting, respectively, the first and second signals of the aforementioned differential input part, and a switch control means which can keep said switch in an open state before the voltage of the output signal of the aforementioned output part reaches a level close to the aforementioned prescribed voltage and can close said switch after the voltage of the output signal of said output part reaches a level close to said prescribed voltage.

As another preferable embodiment, the aforementioned differential input part and/or output part includes a constant current source circuit, and the aforementioned operation control means includes a constant current source control means which can keep said constant current source circuit in an on state before the voltage of the output signal of said output part reaches a level close to the aforementioned prescribed voltage and can turn off said constant current source circuit after the voltage of the output signal of said output part reaches a level close to said prescribed voltage.

REFERENCE NUMERALS AND SYMBOLS AS SHOWN IN THE DRAWINGS

In the figures, 10 represents a liquid crystal panel, 12 a controller, 14 an image signal processing circuit, 16 a gradation voltage generating circuit, S1, S2 a signal line driver, 20L, 20R a signal line driving part, 32L, 32R a voltage follower, 40L, 40R an on/off switch, 42L, 42R, a changeover switch, 44L, 44R, a differential input part, 46L, 46R an output part, 58L, 58R, 60L, 60R a constant current source circuit.

DESCRIPTION OF THE EMBODIMENTS

Preferred embodiments of the present invention will be explained in the following with reference to FIGS. 1–4.

Figure 1:
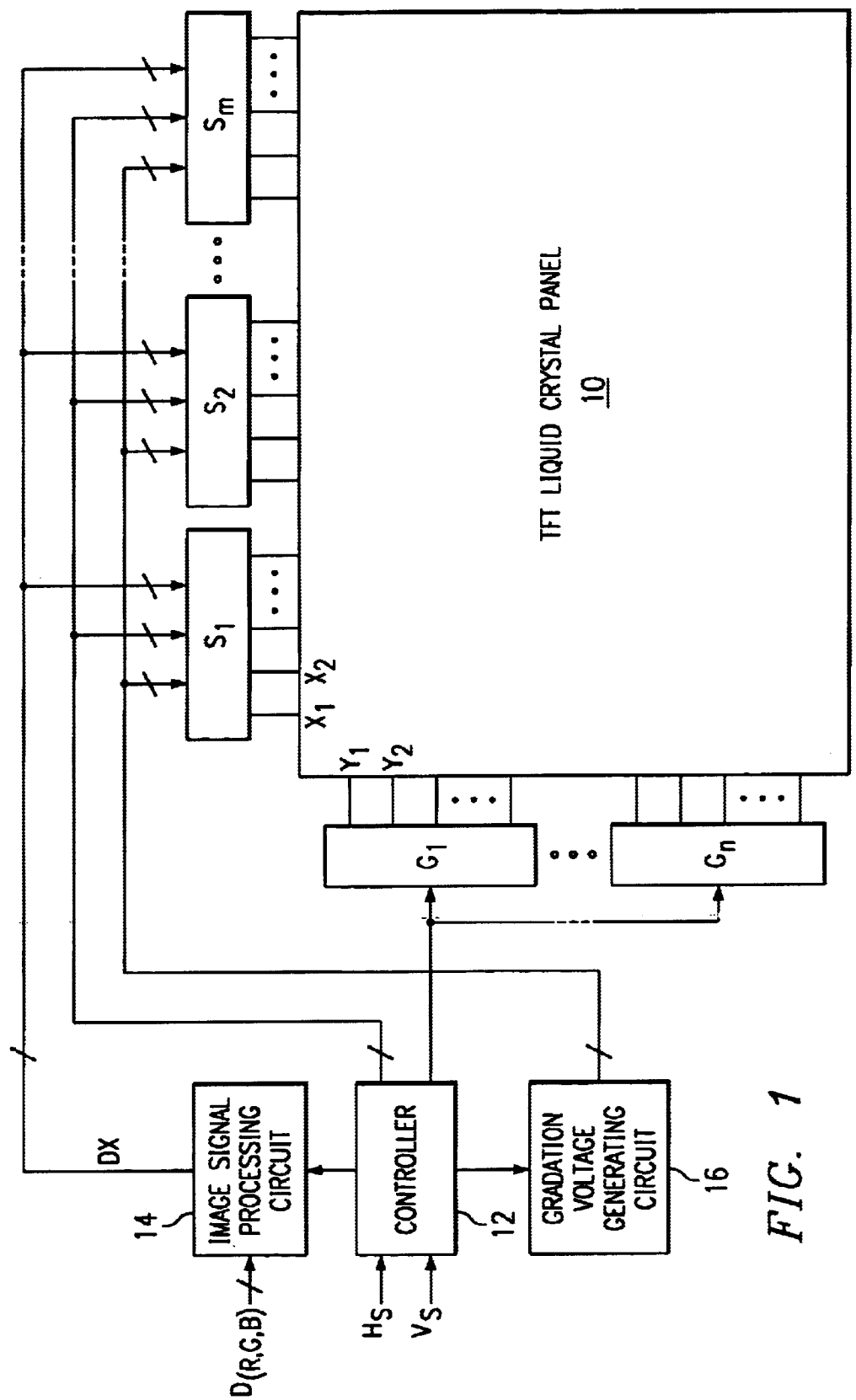
FIG. 1 is a schematic diagram illustrating the configuration of an active matrix type full color TFT-LCD using the driving circuit of the present invention.

FIG. 1 is a schematic diagram illustrating the configuration of an active matrix type full-color TFT-LCD using the driving circuit of the present invention.

Figure 5:
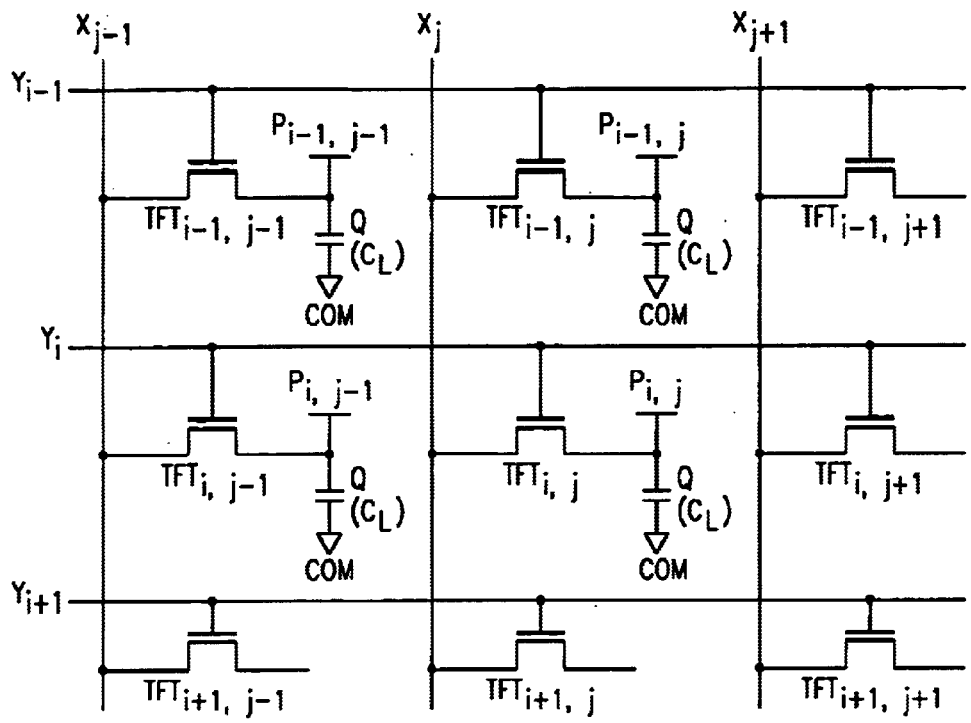
FIG. 5 is a diagram illustrating the fundamental circuit configuration (in part) of a TFT liquid crystal panel.

The TFT-LCD is comprised of a TFT liquid crystal panel 10 which has the same configuration as that shown in said FIG. 5, gate line drivers G1, G2, . . . which are connected in parallel with each other to drive gate lines Y1, Y2, . . . of said liquid crystal panel 10, signal line (source) drivers S1, S2, . . . which are connected in parallel with each other to drive signal lines X1, X2, . . . of liquid crystal panel 10, controller 12 which controls the operation of each part, image signal processing circuit 14 which performs prescribed signal processing with respect to the image signals to be displayed, and a gradation voltage generating circuit 16 which can generate multiple voltage levels for realizing full color (multi-gradation display).

Image signal processing circuit 14 supplies digital image data DX that indicate the display gradation of each pixel to various signal line drivers S1, S2, . . . . For example, in the case of 64 gradations, 6-bit image data DX for each pixel of R, G, B are supplied from image signal processing circuit 14 to each of signal line drivers S1, S2, . . . . Controller 12 supplies various types of control signals or timing signals synchronized with horizontal synchronizing signal HS and vertical synchronizing signal VS to various gate line drivers G1, G2, . . . and various signal line drivers S1, S2 . . . .

Figure 6:
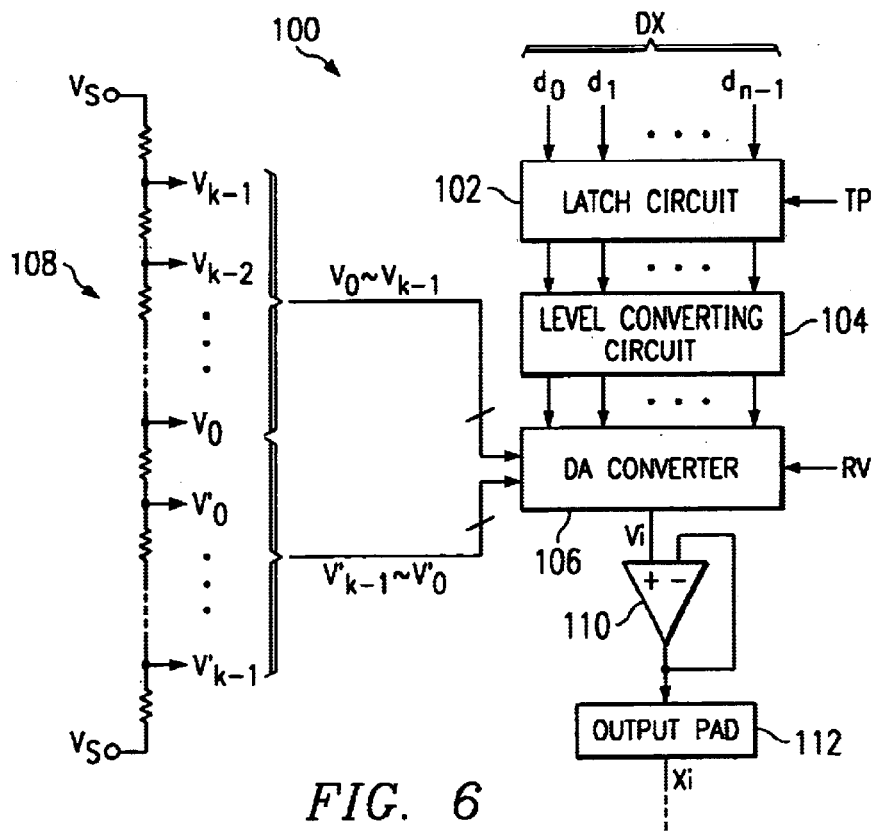
FIG. 6 is a block diagram illustrating the configuration of the main parts of a signal line driving part including a conventional driving circuit.
Figure 7:
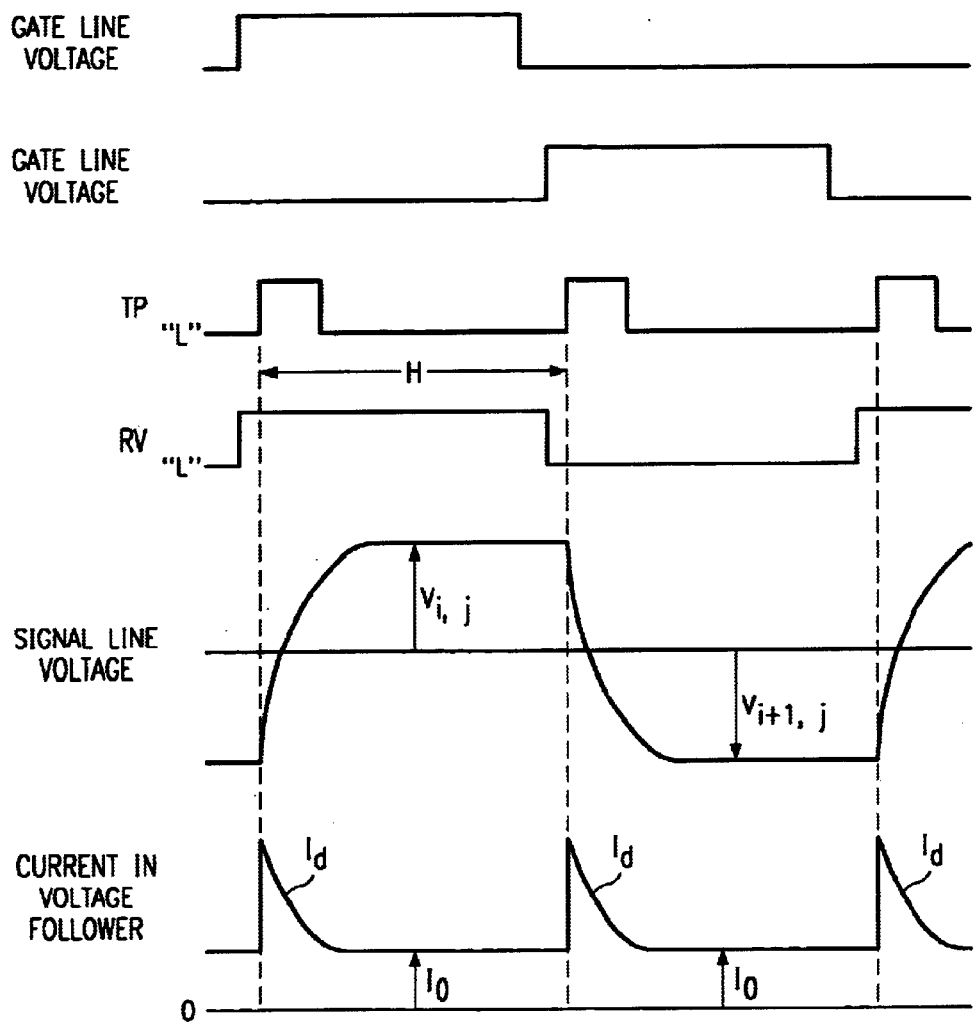
FIG. 7 is a diagram illustrating the waveform of each part, for clarifying the operation of the signal line driving part shown in FIG. 6.

Gradation voltage generating circuit 16 supplies multiple voltage gradations having respective voltage levels corresponding to the multiple display gradations, based on the V (voltage)–T (transmissivity) of liquid crystal panel 10, to various signal line drivers S1, S2, . . . . When a liquid crystal AC voltage is applied using the common constant driving method, the gradation voltage generating circuit can be constituted with the same voltage dividing resistance circuit 106 shown in FIG. 6 to generate V0 to Vk−1 with positive polarity and V'k−1 to V'0 with negative polarity.

Figure 2:
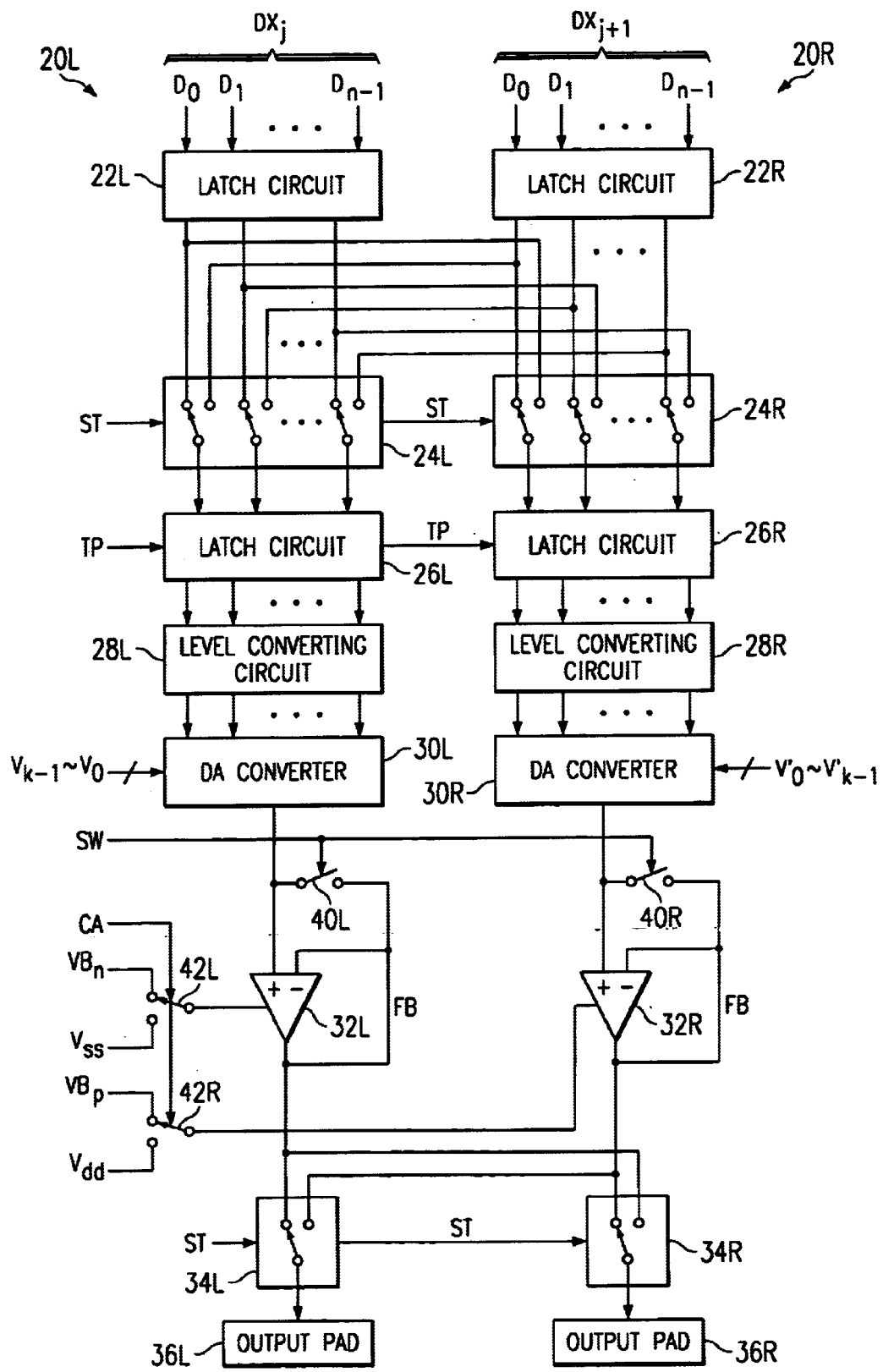
FIG. 2 is a block diagram illustrating the circuit configuration of the main parts of the signal line driver disclosed in an embodiment.

FIG. 2 shows the circuit configuration of the main parts of signal line driver S. More specifically, it shows the measurement of the signal line driving parts for each of two adjacent channels. The signal line driving parts 20L and 20R of the two channels shown in the figure are used to drive the signal lines Xj and Xj+1 of the adjacent jth column and (j+1)th column of liquid crystal panel 10.

As shown in FIG. 2, the signal line driving parts 20L and 20R for each two adjacent channels comprise a pair of first data latch circuits 22L and 22R, a pair of first switching circuits 24L and 24R, a pair of second data latch circuits 26L and 26R, a pair of level converting circuits 28L and 28R, a pair of DA converters 30L and 30R, a pair of voltage followers (driving circuits) 32L and 32R, a pair of second switching circuits 34L and 34R, as well as a pair of output pads 36L and 36R.

The image data DXj, DXj+1 for one pixel having a prescribed number of bits are input during a prescribed period, such as the line period, to the first data latch circuits 22L and 22[R] on the left and right sides.

For each bit, the output terminal of the first data latch circuit 22L on the left side is connected to one (left side) input terminal of the first switching circuit 24L on the left side and to the other (right side) input terminal of the second switching circuit 24R on the right side. For each bit, the output terminal of the first data latch circuit 22R on the right side is connected to one (left side) input terminal of the first switching circuit 24R on the right side and to the other (right side) input terminal of the first switching circuit 24L on the left side.

The first switching circuits 24L and 24R on the left and right sides are switched alternately between one (left side) input terminal and the other (right side) input terminal depending on an AC signal ST sent from a controller (not shown in the figure). The output terminals of the first switching circuits 24L and 24R on the left and right sides are connected to the input terminals of the second data latch circuits 26L and 26R on the left and right sides, respectively.

The second data latch circuit 26L and 26R on the left and right sides can input the image data for one pixel from either the first data latch circuit 22L on the left side or the first data latch circuit 22R on the right side via the first switching circuits 24L and 24R on the left and right sides with a timing synchronized with the AC signal ST. The output terminals of the second data latch circuits 26L and 26R on the left and right sides are connected to the input terminals of the DA converters 30L and 30R on the left and right sides via the level converting circuits 28L and 28R on the left and right sides, respectively.

Level converting circuits 28L and 28R convert the logic voltage (for example, 3 V) of the image data to a high voltage (for example, 10 V) so that the circuit elements in DA converters 30L and 30R can handle the gradation voltages for both positive and negative polarities using the common constant driving method.

All of the V0 to Vk−1 (a total of k voltages) with positive polarity are supplied to the DA converter 30L on the left side from gradation voltage generating circuit 28 [sic; 16]. On the other hand, all of the V'k−1 to V'0 (a total of k voltages) with negative polarity are supplied to the DA converter 30R on the right side from gradation voltage generating circuit 28.

For example, in the common constant driving method, when the voltage of the counter electrode is fixed at 5 V and the gradation voltage with positive polarity (5–10 V) and the gradation voltage with negative polarity (5–0 V) are applied alternately to each pixel electrode, the maximum gradation voltage Vk−1 with positive polarity is set at a level that is the closest to 10 V, while the maximum gradation voltage V'k−1 with negative polarity is set at a level that is the closest to 0 V. Also, the minimum V0 and V'0 of the two polarities are set near 5 V.

The DA converter 30L on the left side decodes the image data for one pixel input from the level converting circuit 28L on the left side, followed by selecting and outputting the gradation voltage Vx with positive polarity that has the voltage level corresponding to the display gradation indicated by the image data. The DA converter 30R on the right side decodes the image data for one pixel input from the level converting circuit 28R on the right side, followed by selecting and outputting the gradation voltage V'x with negative polarity that has the voltage level corresponding to the display gradation indicated by the image data. The output terminals of the DA converters 30L and 30R on the left and right sides are connected to the input terminals of the voltage followers 32L and 32R on the left and right sides, respectively.

The voltage follower 32L on the left side comprises an operational amplifier that has a high input impedance and a low output impedance. The voltage follower operates in a source mode in the range of the voltage with positive polarity. The output terminal of voltage follower 32L on the left side is connected to the input terminal of one (left side) input terminal of the second switching circuit 34L on the left side and to the other (right side) input terminal of the second switching circuit 34R on the right side.

The voltage follower 32R on the right side comprises an operational amplifier that has a high input impedance and a low output impedance. The voltage follower operates in a sink mode in the range of the voltage with negative polarity.

The output terminal of the output amplifier 32R on the right side is connected to one (left side) input terminal of the second switching circuit 34R on the right side and to the other (right side) input terminal of the second switching circuit 34L on the left side.

The output terminals of the second switching circuit 34L and 34R on the left and right sides are connected to the signal lines Xj and Xj+1 (not shown in the figure) of each corresponding channel via the output pads 36L and 36R on the left and right sides, respectively.

In the present embodiment, the inverting input terminal (−) and the output terminal of the operational amplifier that constitutes each of said voltage followers 32L and 32R are connected to each other via a through negative feedback circuit FB. This is common for the operational amplifier. The feature of this operational amplifier, however, is that switches 40L and 40R are connected between the non-inverting terminal (+) and the inverting terminal (−). Said switches 40L and 40R are turned on (open)/off (closed) by a control signal SW sent from controller 12 (FIG. 1).

The switches are used to selectively switch some or all of the constant current source circuits between the on (active) state and the off (inactive) state in the operational amplifier that constitutes each of said voltage followers 32L and 32R.

More specifically, a common power supply circuit (not shown in the figure) shared by all of the channels is used to prepare bias voltages (VBn, VBp) for active operation, which can turn on (activate) each constant current source circuit, and bias voltages (Vss, Vdd) for suspending the operation, which can turn off (deactivate) each constant current source circuit, with respect to the prescribed constant current source circuits incorporated in voltage followers 32L and 32R. By controlling switching of said switches 42L and 42R depending on the control signal CA sent from controller 12, either the bias voltages (VBn, VBp) for active operation or the bias voltages (Vss, Vdd) for suspending the operation can be selected and supplied to said prescribed constant current source circuits.

Figure 3A:
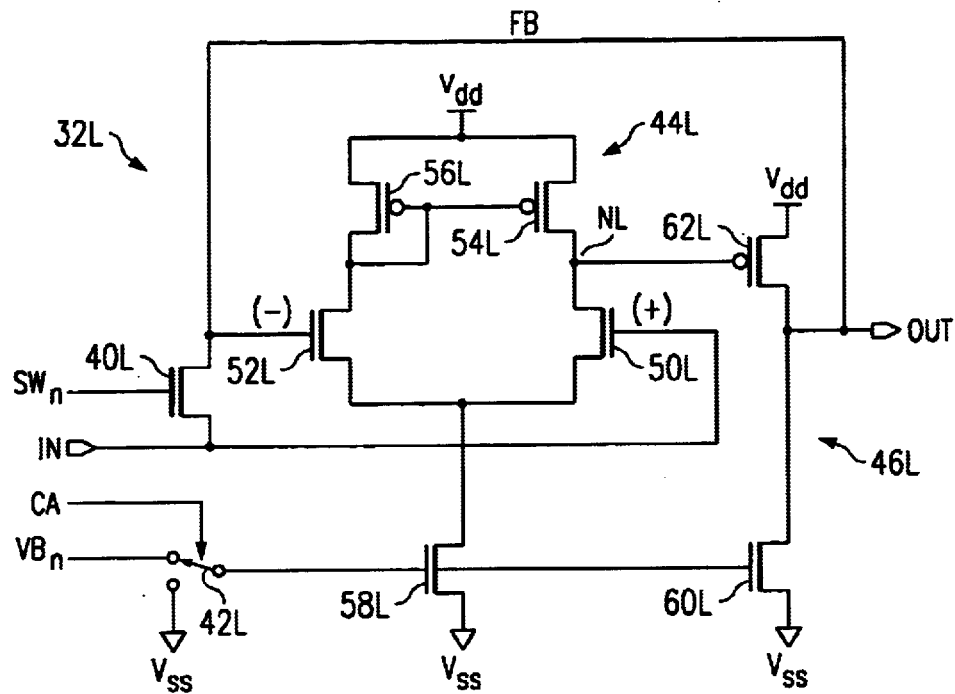
FIG. 3 is a circuit diagram illustrating the circuit configuration of the voltage follower disclosed in the embodiment.
Figure 3B:
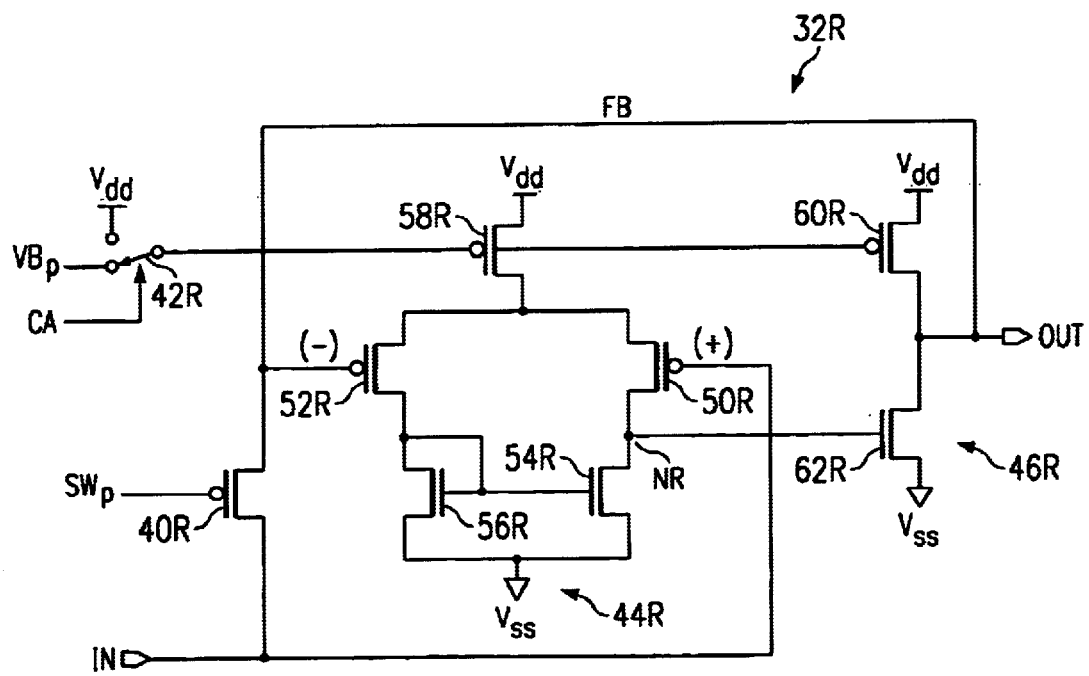

FIG. 3 shows a circuit configuration example of voltage followers 32L and 32R used in said embodiment. Said voltage followers 32L and 32R are comprised of differential input parts 44L, 44R and output parts 46L, 46R.

In the voltage follower 32L on the left side, differential input part 44L is comprised of a pair of N-channel MOS transistors (referred to as NMOS transistors hereinafter) 50L and 52L which are connected differentially, NMOS transistor 58L used for constant current source circuit and connected to the source terminals of said two NMOS transistors 50L and 52L, and a pair of P-channel MOS transistors (referred to as PMOS transistors hereinafter) 54L and 56L which are connected to the drain terminals of said two NMOS transistors 50L and 52L.

For NMOS transistors 50L and 52L, the gate terminal of NMOS transistor 50L is connected as the non-inverting input terminal (+) to the input terminal IN, while the gate terminal of NMOS transistor 52L is connected as the inverting input terminal (−) to the output terminal OUT via through negative feedback FB. A switch 40L made of an NMOS transistor is connected between the two gate terminals. The source terminal of the NMOS transistor 58L of the constant current source is connected to the power supply voltage terminal Vss on the negative electrode side. Its gate terminal is connected to either bias voltage VBn or Vss via switch 42L.

Output part 46L is comprised of NMOS transistor 60L for a constant current source circuit and PMOS transistor 62L for driving. The source terminal of NMOS transistor 60L is connected to the power supply voltage terminal Vss on the negative electrode side. Its drain terminal is connected to the output terminal OUT, and its gate electrode is connected to either bias voltage VBn or Vss via switch 42L. The source terminal of the PMOS transistor 62L for driving is connected to the power supply voltage terminal Vdd on the positive electrode side. Its drain terminal is connected to the output terminal OUT, and its gate terminal is connected to the output terminal (node) NL of the differential input part. In said configuration, differential input part 44L has a differential amplification function, while output part 46L has an output amplification function.

Said switch 42L can be an analog switch comprised of a transmission gate.

When said voltage follower 32L supplies bias voltage VBn to each constant current source circuit 58L, 60L, it acts as a source-type voltage follower.

That is, when the voltage at input terminal IN rises from a state where the voltage at input terminal IN is equal to the voltage at output terminal OUT, the drain current of NMOS transistor 50L is increased in differential input part 44L. On the other hand, the drain current of NMOS transistor 52L is reduced, and the potential at node NL drops. As a result, the drain current of the PMOS transistor 62L for driving in output part 46L is increased, and the load (signal line X) is charged. When the voltage at output terminal OUT becomes equal to the voltage at input terminal IN, the state of each part becomes stable.

When the voltage at input terminal IN drops from a state where the voltage at input terminal IN is equal to the voltage at output terminal OUT, the operation of each part is carried out in the opposite way. The drain current of the PMOS transistor 62L for source is reduced, and the drain current of the NMOS transistor 60L of the constant current source becomes the discharging current of the load (signal line X). When the voltage at output terminal OUT becomes equal to the voltage at input terminal IN, the state of each part becomes stable.

If the bias voltage with respect to each constant current source circuit 58L, 60L is changed from VBn to Vss in voltage follower 32L, each constant current source circuit 58L, 60L is turned off, and no current flows through them. By turning off constant current source circuit 58L in differential input part 44L, the potential at the output terminal (node) NL rises almost to the level of power supply voltage Vdd. As a result, driving transistor 62L is also turned off in output part 46L.

The voltage follower 32R on the right side has a configuration such that each NMOS transistor in said voltage follower 32L on the left side is replaced with a PMOS transistor, while each PMOS transistor is replaced with an NMOS transistor.

In the NMOS transistors 50R and 52R of the differential pair, the gate terminal of PMOS transistor 50R is connected to input terminal IN as the non-inverting input terminal (+), while the gate terminal of PMOS transistor 52R is connected as the inverting input terminal (−) to the output terminal OUT via the through negative feedback circuit FB. An opening/closing switch 40R made of a PMOS transistor is connected between the two gate terminals. Also, the source terminal of the PMOS transistor 58R of the constant current source is connected to the power supply voltage terminal Vdd on the positive electrode side, and its gate terminal is connected to either bias voltage VBp or Vdd via switch 42R. In the output part 46R, the source terminal of the PMOS transistor 60R of the constant current source is connected to the power supply voltage terminal Vdd on the positive electrode side. Its drain terminal is connected to the output terminal OUT, and its gate terminal is connected to either bias voltage VBp or Vdd via switch 42R.

When said voltage follower 32R supplies bias voltage VBp to each constant current source circuit 58R, 60R, it acts as a sink-type voltage follower in the same way as described above. When the bias voltage applied to each constant current source circuit 58R, 60R is changed from VBp to Vdd, each constant current source circuit 58R, 60R is turned off, and no current flows through them. By turning off constant current source circuit 58R in differential input part 44R, the potential at the output terminal (node) NR drops almost to the level of the power supply voltage Vss. In output part 46R, not only constant current source circuit 60R but also driving transistor 62R are turned off.

In the following, the operation of the signal line drivers disclosed in the present embodiment will be explained. In a TFT-LCD where the aforementioned signal line drivers are incorporated, the gate lines Y1, Y2, . . . of liquid crystal panel 10 are scanned sequentially, selected one line (row) at a time during one frame period, and driven to an active state by gate line drivers G1, G2, . . . . When each gate line Yj [sic; Yi] is driven, a gradation voltage Vj to be applied to the corresponding pixel electrode on the corresponding [signal] line is output from the output pad 36 of a channel by a signal line driver.

When the gate line Yi of row i is driven, each of the first switching circuits 24L and 24R as well as each of the second switching circuits 34L and 34R are switched to one input terminal (left side). At that time, the image data DXi, j, and DXi, j+1 that indicate the display gradations of the two pixels positioned in row i and column j as well as in row i and column (j+1) in liquid crystal panel 10 are stored in the first data latch circuits 22L and 22R.

In this case, the image data DXi, j for one pixel is transferred from the first data latch circuit 22L on the left side to the second data latch circuit 26L on the left side via the first switching circuit 24L on the left side corresponding to a timing pulse TP or the timing of AC signal ST. At the same time, the image data DXi, j+1 for one pixel is transferred from the first data latch circuit 22R on the right side to the second data latch circuit 26R on the right side via the first switching circuit 26R on the right side.

The image data DXi, j and DXi, j+1 for one pixel that are input to the second data latch circuits 26L and 26R on the left and right sides are then input to the DA converters 30L and 30R on the left and right sides via the level converting circuits 28L and 28R on the left and right sides, respectively.

In this way, a gradation voltage Vi, j with positive polarity and having a voltage level corresponding to the display gradation indicated by image data DXi, j is output from the DA converter 30L on the left side. On the other hand, a gradation voltage Vi, j+1 with negative polarity and having a display gradation indicated by image data DXi, j+1 is output from the DA converter 30R on the right side.

The gradation voltage Vi, j with positive polarity output from the DA converter 30L on the left side is output to signal line Xj from the output pad 36L on the left side via the voltage follower 32L and the second switching circuit 34L on the left side. The voltage is applied to pixel electrode Pi, j via the thin film transistor TFTi, j of row i that is connected to the signal line Xj.

On the other hand, the gradation voltage Vi, j+1 with negative polarity output from the DA converter 30R on the right side is output to signal line Xj+1 from output pad 36R on the right side via the voltage follower 32R and the second switching circuit 34R on the right side. The voltage is applied to pixel electrode Pi, j+1 via thin film transistor TFTi, j+1 of row i that is connected to the signal line Xj+1.

Then, when the gate line Yi+1 of row (i+1) is driven, each of the first switching circuits 24L and 24R as well as each of the second switching circuits 34L and 34R are switched to the other (right side) input terminal depending on AC signal ST.

As a result, the image data DXi+1, j for one pixel corresponding to signal line Xi is transferred from the first data latch circuit 22L on the left side to the second data latch circuit 26R on the right side via the first switching circuit 24R on the right side. At the same time, the image data DXi+1, j+1 for one pixel corresponding to signal line Xi+1 is transferred from the first data latch circuit 22R on the right side to the second data latch circuit 26L on the left side via the first switching circuit 24L on the left side.

The image data DXi+1, j+1 and DXi+1, j for one pixel that are input to the second data latch circuits 26L and 26R on the left and right sides are then input to the DA converters 30L and 30R on the left and right sides via the level converting circuits 28L and 28R on the left and right sides, respectively.

In this way, a gradation voltage Vi+1, j+1 with positive polarity and having a voltage level corresponding to the display gradation indicated by image data DXi+1, j+1 is output from the DA converter 30L on the left side. On the other hand, a gradation voltage Vi+1, j with negative polarity and having a voltage level corresponding to the display gradation indicated by image data DXi+1, j is output from the DA converter 30R on the right side.

The gradation voltage Vi+1, j+1 output from the DA converter 30L on the left side is output to signal line Xj+1 from the output pad 36R on the right side via the voltage follower 32L on the left side and the second switching circuit 34R on the right side. The voltage is applied to the corresponding pixel electrode Pi+1, j+1 via thin film transistor TFTi+1, j+1 of row (i+1) that is connected to the signal line Xj+1.

On the other hand, the gradation voltage Vi+1, j output from the DA converter 30R on the right side is output to signal line Xj from the output pad 36L on the left side via the voltage follower 32R on the right side and the second switching circuit 34L on the left side. The voltage is applied to the corresponding pixel electrode Pi+1, j via thin film transistor TFTi+1, j of row (i+1) that is connected to the signal line Xj.

Subsequently, the operation for the aforementioned two lines is repeated. In this way, the polarity of the gradation voltage for each pixel in the Y direction of liquid crystal panel 10 is inverted. The polarity of the gradation voltage for each pixel (between every two adjacent signal lines Xj and Xj+1) in the X direction is also inverted. When the polarity of the gradation voltage is inverted for the adjacent signal lines or pixel electrodes, the current flowing in the adjacent pixel electrodes or counter electrodes can be cancelled out. In this way, deterioration of the display quality can be restrained.

Each of switching circuits 24L, 24R, 34L, and 34R is controlled in such a way that it is switched for each frame depending on the AC signal ST (that is, the position of each of switching circuits 24L, 24R, 34L, and 34R is inverted for each frame when the gate line Yi of each row is driven). An electrode voltage waveform obtained using the common constant driving method can be realized depending on said inversion of the frame period.

As described above, for the signal line drivers disclosed in the present embodiment, in the driving parts for every two adjacent channels, the DA converter 30L and voltage follower 32L on the left side are specifically used for the gradation voltage with positive polarity, while the DA converter 30R and voltage follower 32R on the right side are specifically used for the gradation voltage with negative polarity. The first switching circuits 24L and 24R arranged ahead of the two DA converters 30L and 30R, as well as the second switching circuits 34L and 34R arranged after the two voltage followers 22L and 22R, are switched during a prescribed period, such as the line period and frame period. In this way, both the common constant driving method and dot inversion (inversion for each pixel) can be realized.

In this signal line driving system, because the offsets of the two voltage followers 32L and 32R used alternately to drive one signal line X are different, when the combined offsets are applied to the signal line X, the error of the gradation display might be doubled.

Figure 4:
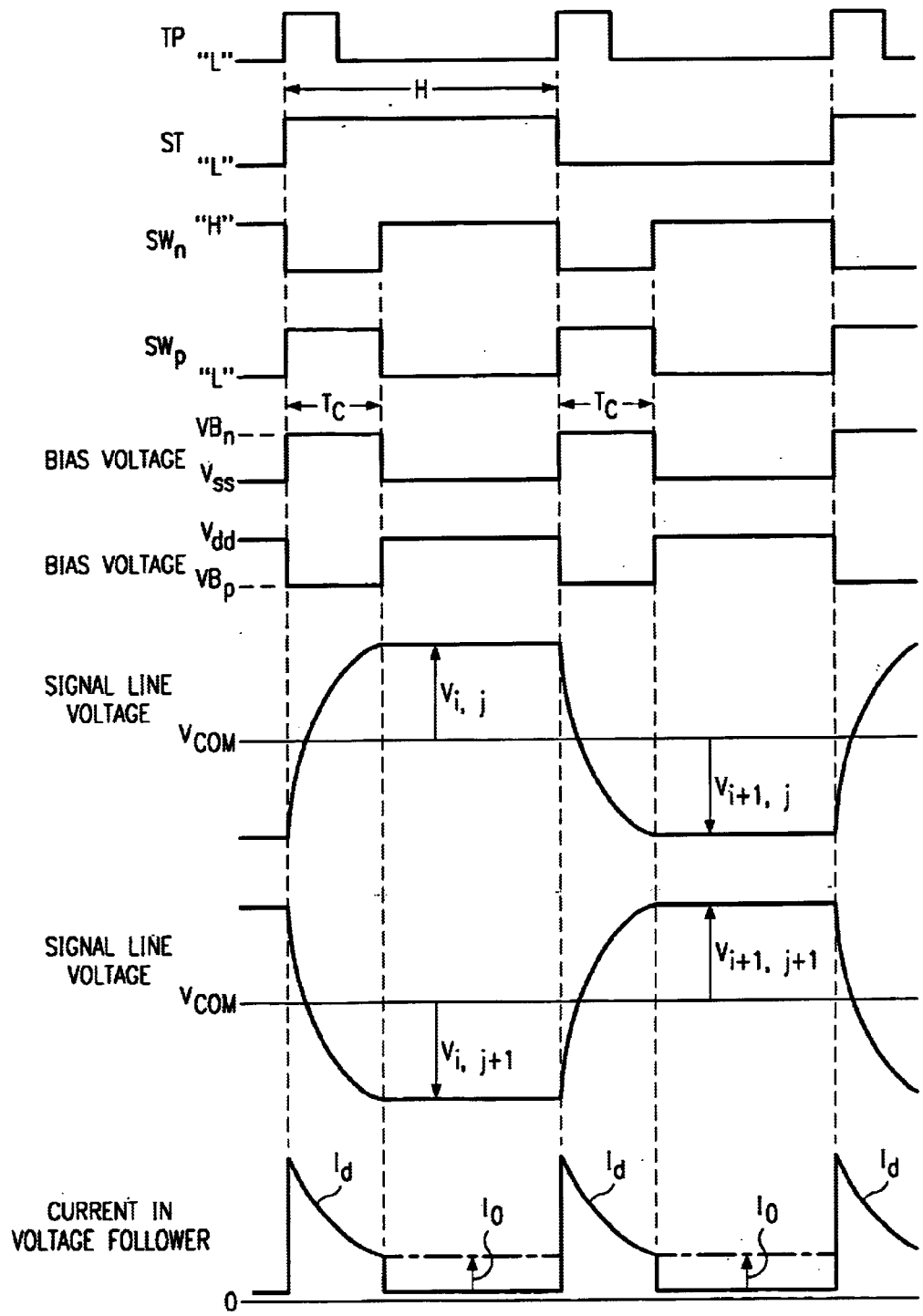
FIG. 4 is a diagram illustrating the waveform of each part, for clarifying the operation of the signal line driver disclosed in the embodiment.

As described in the present embodiment, this problem can be solved easily and efficiently by adopting said configuration around the two voltage followers 32L and 32R and by carrying out control as shown in FIG. 4.

As shown in FIG. 4, during the operation of each line, the gradation voltage of the corresponding line is applied to DA converters 30L and 30R at the beginning of timing pulse TP, and the operations of the two voltage followers 32L and 32R are started from that point in time. At the timing point when the operation is started, the opening/closing switches 40L and 40R in the two voltage followers 32L and 32R are in an off (closed) state. The bias voltages (VBn, VBp) for the active operation are selected for the constant current source circuits 58, 60 in the two voltage followers 32L and 32R.

The voltage follower 32L on the left side carries out voltage driving of the source mode as follows. A new gradation voltage with positive polarity is input from DA converter 30L to input terminal IN. The output voltage with negative polarity on the output terminal side, that is, the voltage of the signal line, is subjected to negative feedback to the inverting input terminal (−), and the output voltage is raised to the level of the input gradation voltage V. On the other hand, the voltage follower 32R on the right side carries out voltage driving of the sink mode as follows. A new gradation voltage with negative polarity is input from DA converter 30R to the input terminal IN. The output voltage with positive polarity on the output terminal side, that is, the voltage of the signal line, is subjected to negative feedback to the inverting input terminal (−), and the output voltage is lowered to the level of the input gradation voltage V.

After a prescribed period of time Tc has elapsed since the beginning of timing pulse TP, controller 12 turns on (closes) opening/closing switches 40L and 40R in the two voltage followers 32L and 32R and controls switches 42L and 42R to change the bias voltages with respect to the constant current source circuits 58, 60 in the two voltage followers 32L and 32R to voltages (Vss, Vdd) used for suspending the operation. The time Tc is set as the time when the output voltages in the two voltage followers 32L and 32R reach the level of the input gradation voltage. Since the rise/drop rate (time) of the output voltage is mainly determined by the impedance, time constant, etc. of the circuit including a load, a common switching time Tc can be set for all of the input gradation voltages.

In the two voltage followers 32L and 32R, when the bias voltages are switched to voltages (Vss, Vdd) used for suspending the operation, the constant current source circuits 58, 60 are turned off, and the outputs of output parts 62L and 62R are electrically cut off from the output terminal OUT. On the other hand, when opening/closing switches 40L and 40R are turned on (closed), the input output from DA converters 30L and 30R are supplied to the signal lines of the loads from the output terminal OUT via the negative feedback circuit FB of voltage followers 32L and 32R. At that point in time, since the voltage of the signal line reaches the target value, that is, a level near the input gradation voltage, the output from DA converters 30L and 30R are little influenced by the impedance on the signal line side.

After the output voltage of each of voltage followers 32L and 32R reaches the target value, that is, a level near the input gradation voltage, the operation of each of voltage followers 32L and 32R is stopped and electrically cut off from each signal line. Instead, the output from DA converters 30L and 3 OR are supplied to the signal lines via the negative feedback circuits FB. In this way, the desired voltage can be written correctly to each pixel electrode whether there is an offset or not in voltage followers 32L and 32R. Although it is not shown in FIG. 4, in the cycle of each line, the active time of each gate line ends immediately before the next timing pulse TP, and the gradation voltage written at that point in time is sampled and retained in the corresponding pixel electrode.

Also, in the two voltage followers 32L and 32R, when constant current source circuits 58, 60 are in the off state, there is no current flowing in either part, and the current consumption is reduced almost to zero. Since there is no idling-standby current (Io), the current consumption is reduced.

In said embodiment, the negative feedback circuit FB of each of voltage followers 32L and 32R is used for the bypass circuit. It is also possible, however, to use a special-purpose bypass circuit that is connected to the output terminal OUT, and to connect an opening/closing switch 40 between the bypass circuit and the input terminal IN. The present invention can also be applied to a voltage follower for both source mode and sink mode of the signal line driving part shown in FIG. 6.

In the voltage follower described in said embodiment, the constant current source circuit is switched from the on state to the off state when the input terminal IN and the output terminal OUT are shorted at the point in time when a prescribed period of time Tc has elapsed since an input signal with a prescribed voltage was input to the input terminal IN. The switching point in time, however, can also be set, in a variable manner, to correspond to the voltage level of the input signal.

It is also possible to use a comparator that compares the voltage of the input signal (or a voltage set near the voltage of the input signal) to the voltage of the output signal and to use the point in time when the comparator output varies as the switching time point:

It is also possible to stagger the timing for when the input terminal IN is connected to the output terminal OUT and the timing for when the constant current source circuit is switched from the on state to the off state (the first timing is usually the same as or later than the second timing).

The present invention is not limited to said configuration, and various modifications can be made. In particular, the configuration of the voltage followers 32L and 32R disclosed in said embodiment is only one example. The present invention can be applied to operational amplifiers or voltage followers with any configuration. The driving circuit of the present invention can be used in various applications other than a signal line driving circuit.

As explained above, by using the driving circuit of the present invention, the influence of the offset can be compensated or avoided in an easy and efficient way, and the voltage of the output signal can be correctly matched with the voltage of the input signal, that is, the target value. Also, the current consumption can be reduced significantly.

What is claimed is:

1. A voltage driver comprising:
   an operational amplifier having a non-inverting input and an inverting input, the non-inverting input being coupled to a voltage input signal and the inverted input being coupled to an output of the operational amplifier;
   a switching circuit coupled between output of the operational amplifier and the non-inverting input, the switching circuit connecting the voltage input signal to the output when the output of the operational amplifier reaches substantially the level of the input signal, whereby an offset voltage of the operational amplifier is substantially eliminated.

2. The voltage driver of claim 1 further comprising a control circuit generating a switching signal to control the switching circuit for coupling the non-inverting input to the operational amplifier to the output thereof.

3. The voltage driver of claim 1 wherein the operational amplifier comprises a differential input circuit coupled to the non-inverting and inverting inputs and a constant current source coupled to the output.

4. The voltage driver of claim 2 wherein the operational amplifier comprises a differential input circuit coupled to the non-inverting and inverting inputs and a constant current source coupled to the output.

5. The voltage driver of claim 4 wherein the control circuit places the constant current source in an off state when the switching signal operates the switching circuit to connect the non-inverting input of the operational amplifier to the output thereof.

6. The voltage driver of claim 5 wherein the control circuit changes a bias voltage applied to the constant current source to place the constant current source in an off state.

7. The voltage driver of claim 1 wherein the voltage input signal comprises an LCD gradation voltage and the output is coupled to an LCD.

8. The voltage driver of claim 2 wherein the voltage input signal comprises an LCD gradation voltage and the output is coupled to an LCD.

9. The voltage driver of claim 3 wherein the voltage input signal comprises an LCD gradation voltage and the output is coupled to an LCD.

10. The voltage driver of claim 4 wherein the voltage input signal comprises an LCD gradation voltage and the output is coupled to an LCD.

11. The voltage driver of claim 5 wherein the voltage input signal comprises an LCD gradation voltage and the output is coupled to an LCD.

12. The voltage driver of claim 6 wherein the voltage input signal comprises an LCD gradation voltage and the output is coupled to an LCD.

13. The voltage driver of claim 7 wherein the LCD is a TFT-LCD.

14. The voltage driver of claim 8 wherein the LCD is a TFT-LCD.

15. The voltage driver of claim 7 wherein the LCD is a TFT-LCD.

16. The voltage driver of claim 10 wherein the LCD is a TFT-LCD.

17. The voltage driver of claim 11 wherein the LCD is a TFT-LCD.

18. The voltage driver of claim 12 wherein the LCD is a TFT-LCD.

* * * * *